United States Patent
Shibata

(10) Patent No.: US 6,252,458 B1
(45) Date of Patent: Jun. 26, 2001

(54) DIFFERENTIAL AMPLIFIER

(75) Inventor: Kohei Shibata, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/428,755

(22) Filed: Oct. 28, 1999

(30) Foreign Application Priority Data

Dec. 2, 1998 (JP) .................................................. 10-342761

(51) Int. Cl.$^7$ ....................................................... H03F 3/45
(52) U.S. Cl. ............................................ 330/261; 330/253
(58) Field of Search ........................................ 330/252, 253, 330/257, 261

(56) References Cited

U.S. PATENT DOCUMENTS

| | | | |
|---|---|---|---|
| 3,643,183 | * | 2/1972 | Geffe .................................... 333/80 R |
| 4,553,107 | * | 11/1985 | Ogawa ................................... 330/288 |
| 4,887,048 | * | 12/1989 | Krenik et al. ......................... 330/258 |
| 4,893,092 | * | 6/1993 | Okamoto .............................. 330/253 |
| 5,220,289 | * | 6/1993 | Kunitaka .............................. 330/257 |

FOREIGN PATENT DOCUMENTS 06140849  5/1994  (JP) .

* cited by examiner

Primary Examiner—Robert Pascal
Assistant Examiner—Henry Choe
(74) Attorney, Agent, or Firm—Helfgott & Karas, P.C.

(57) ABSTRACT

A differential amplifier having an integrated resistance load type differential pair in which a constant current which varies to suppress a small signal gain variation of a resistance load type differential pair caused by variations of circumferential conditions and manufacturing process conditions and a constant current which varies to suppress a limiter amplitude variation of the resistance load type differential pair caused by the variations of the same conditions are mixed at a fixed ratio under a condition which is most frequently used among the circumferential conditions and a condition which is best achieved among the manufacturing process conditions, which is used as a bias current of the differential pair.

14 Claims, 12 Drawing Sheets

US 6,252,458 B1

DIFFERENTIAL AMPLIFIER

BACKGROUND OF THE INVENTION

1. Field of the Invention

The present invention relates to a differential amplifier, and in particular to a differential amplifier having a resistance load type differential pair in an integrated circuit.

The differential amplifier is utilized in a large number of electric circuits regardless of technical fields, and many of these electric circuits are utilized in an integrated form such as an IC or LSI.

As for circuit parts such as transistors, only discrete parts which had fulfilled the specification have been shipped. Therefore, circuit designs for the discrete parts have been made possible without much consideration of manufacturing process conditions because of little individual differences between the parts. Only consideration focused on circumferential variations such as temperature in use had to be made. However, as demands for speedup and space saving increase in the market, the integration of the circuits has been urged.

Integrated circuit designs, considering a manufacturing yield, require circuit designs allowing individual differences between lots depending on manufacturing process conditions.

Furthermore, minute machining for IC's (or LSI's) has been energetically advanced in recent years for the purpose of the speedup and cost reduction. Along with this, source voltages of electric circuits tend to decrease. This is because a malfunction caused by an occurrence of a leak current or the like due to an insulator destruction with a high voltage is prevented since the thickness of an oxide film of a gate or the like is thinned by the minute machining, taking a CMOS transistor as an example.

Therefore, a direct current design at a low voltage considering variations of circumferential and manufacturing process conditions has become more and more difficult. Particularly, it is required for a differential amplifier in many cases, especially in such a case as performing a feed forward control, that the gain variation is small against the variations of the circumferential and manufacturing process conditions.

2. Description of the Related Art

For a bias current of a differential amplifier, a current source (constant current source) ① as shown in FIG. 8 for suppressing a current amount variation caused by variations of circumferential conditions, a current source ② as shown in FIG. 9 for suppressing an internal resistance variation in an amplifier having a resistance load type differential pair and suppressing a limiter amplitude variation, or. a current source ③ as shown in FIG. 10 for suppressing a small signal gain variation in an amplifier having a resistance load type differential pair has been so far used individually according to the object of use. Hereinafter, the respective operations will be described taking a CMOS transistor as an example.

Firstly, the current source (constant current source) ① shown in FIG. 8 will be described. It is often the case that an integrated circuit IC1 internally has a reference constant voltage source S1 utilizing PN semiconductor junctions with an output voltage $V_{BGR}$ to the extent of 1.2V which is called a band gap reference (BGR), having an extremely little variation dependency on the variations of the circumferential and manufacturing process conditions.

This reference voltage $V_{BGR}$ is dropped by a voltage divider r1 to an allowable input range of an operational amplifier OA1 to make a reference potential $V_{ref}$ thereof. The operational amplifier OA1 controls a transistor M11 so that a potential $R_c \times I_c$ by a current $I_c$ which flows through a resistor r2 (resistance $R_c$) which is externally connected to the integrated circuit IC1 is equal to the reference potential $V_{ref}$. Thus, the current source ① of FIG. 8 outputs a current determined by the following equation:

$$I_c = V_{ref}/R_c \qquad \text{Eq. (1)}$$

It is to be noted that the reference voltage $V_{ref}$ has a little dependency on condition variations since it is generated from the voltage $V_{BGR}$ which has little dependency on the condition variations by a voltage division ratio of the resistor r1, which is constant even if the resistance varies. Also, the reference resistor r2 has a very little temperature dependency of less than±several 100 ppm/° C. because of an externally connected component.

Since Eq. (1) includes no element depending on the source, no dependency on a source voltage arises as long as the operational amplifier OA1 or the like has a range of source voltage where a normal operation is enabled. Therefore, a constant current $I_c$ determined by Eq. (1) which has a very little dependency on the condition variations can be obtained. The current $I_c$ is reproduced as a current $I_d$ by a current mirror CM1 which is composed of transistors M12, M14, M13, and M15 so as to be provided as a bias current $I_s$ to a differential pair of an amplifier (not shown) of a resistance load type.

On the other hand, it is generally known that a small signal gain G of an amplifier having a resistance load type differential pair is expressed by the following equation:

$$G = R \times \sqrt{\beta} \times \sqrt{I_s} \qquad \text{Eq. (2)}$$

[R: load resistance, β: gain coefficient of MOS-FET, $I_s$: bias current value]

[$\beta = \mu \cdot C_{ox} \cdot W/L$ (μ: electron mobility, $C_{ox}$: gate oxide film capacity, W: gate width, L: gate length)]

Namely, supposing that an input potential difference of the differential pair is $v_{in}$, an output signal amplitude of $v_{in} \times G$ is generated between a load resistor (not shown) and the differential pair.

Also, a limiter amplitude $V_{lm}$ ($V_{in} \times G \leq V_{lm}$) which is a maximum output amplitude generated between the load resistor and the differential pair is expressed by the following equation:

$$V_{lm} = R \times I_s \qquad \text{Eq. (3)}$$

In view of an integrated circuit having a resistance element in the manufacturing process, the load resistance R and the gain coefficient β vary as the circumferential and manufacturing process conditions vary as given by the following equations:

$$R = R_{typ}(1 \pm \Delta_r) \qquad \text{Eq. (4)}$$

$$\beta = \beta_{typ}(1 \pm \Delta_B) \qquad \text{Eq. (5)}$$

where $R_{typ}$ and $\beta_{typ}$ indicate design values in a circumferential condition which is most frequently used and in a manufacturing process condition (typical condition) which is best achieved, and $\Delta_r$ and $\Delta_B$ indicate variation amounts when the values are off the circumferential and manufacturing conditions.

It is to be noted that upon a circuit design, $\Delta_r$ and $\Delta_B$ are preliminary given to each manufacturing process used from conditions such as a working temperature range and a manufacturing yield according to the design specification. In addition, although $\Delta_r$ and $\Delta_\beta$ have a correlation with the temperature variation in some manufacturing processes, it may be generally considered that they vary independently of the condition variations.

Accordingly, the small signal gain G and the limiter amplitude $V_{lm}$ of the amplifier having the resistance load type differential pair given by Eqs. (2) and (3) are given by the following equations in consideration of the condition variations.

$$G = R_{typ} \times \sqrt{\beta_{typ}} \times \sqrt{I_s} \times (1 \pm \Delta_r) \times (1 \pm \Delta_\beta)^{0.5} \qquad \text{Eq. (6)}$$

$$V_{lm} = R_{typ} \times I_s \times (1 \pm \Delta_r) \qquad \text{Eq. (7)}$$

Therefore, when the current $I_d$ generated by the constant current source ① in FIG. 8 is provided as the bias current $I_s$ (=constant) to the differential pair, Eqs. (6) and (7) can be respectively rewritten as the following equations:

$$G = G_{typ} \times (1 \pm \Delta_r) \times (1 \Delta_\beta)^{0.5} \qquad \text{Eq. (8)}$$

$$[G_{typ} = R_{typ} \times \sqrt{\beta_{typ}} \times \sqrt{I_s} = \text{constant}]$$

$$V_{lm} = V_{typ} \times (1 \pm \Delta_r) \qquad \text{Eq. (9)}$$

$$[V_{typ} = R_{typ} \times I_s = \text{constant}]$$

Namely, it is found that both of the small signal gain G and the limiter amplitude $V_{lm}$ vary with the condition variations.

This kind of current source is mostly used as a bias for a resistance load type differential pair utilizing an external resistor in a manufacturing process for such as a part of a bipolar and a gallium-arsenic series which has no resistance element excluding considerations of resistance variation or for a pair having an active load type differential pair which utilizes an internal resistor of a transistor and which is not suitable for an analog amplification due to an extremely high gain in many cases.

The current source ② shown in FIG. 9 for suppressing or compensating an internal resistance variation in an amplifier (not shown) having a resistance load type differential pair will now be described.

This resistance variation suppressing type current source ② can be provided by replacing the external reference resistor r2 in FIG. 1 with an internal resistor in an integrated circuit IC2 for the suppressing resistor of the constant current source.

Therefore, in this resistance variation suppressing type current source ②, an operational amplifier OA2 controls a transistor M21 so that a voltage drop=$R_{ic} \times I_r$ by a current $I_r$ flowing through a reference resistor r3 of a resistance $R_{ic}$ within the integrated circuit IC2 is equal to the reference potential $V_{ref}$. Thus, the current source ② of FIG. 9 outputs a current determined by the following equation:

$$I_r = V_{ref}/R_{ic} \qquad \text{Eq. (10)}$$

It is to be noted that the reference potential $V_{ref}$ has a little dependency on condition variations. Since Eq. (10) includes no element depending on the source, no dependency on a source voltage arises as long as the operational amplifier OA2 or the like has a range of source voltage where a normal operation is enabled. However, $R_{ic}$ presents a variation similar to Eq. (4) against the condition variations as expressed by the following equation:

$$R_{ic} = r_{typ}(1\Delta_r) \qquad \text{Eq. (11)}$$

When the current $I_r$ in the above-mentioned Eq. (10) by the resistance variation suppressing type current source ② is provided as the bias current $I_s$ to the differential pair, the following equation is given:

$$I_r = I_s/(1 \pm \Delta_r) \qquad \text{Eq. (12)}$$

$$[I_s = (kV_{ref}/r_{typ} = \text{constant}),$$

k: constant determined by current mirror ratio and the like]

Accordingly, by using Eqs. (2) and (3), the small signal gain G and the limiter amplitude $V_{lm}$ of the differential amplifier are respectively expressed by the following equations:

$$G = R \times \sqrt{\beta} \times \sqrt{I_r} = G_{typ} \times (1 \pm \Delta_r)^{0.5} \times (1 \pm \Delta_\beta)^{0.5} \qquad \text{Eq. (13)}$$

$$[G_{typ} = R_{typ} \times \sqrt{\beta_{typ}} \times \sqrt{I_s} = \text{constant}]$$

$$V_{lm} = R \times I_r = V_{typ} (=\text{constant}) \qquad \text{Eq. (14)}$$

$$[V_{typ} = R_{typ} \times I_s = \text{constant}]$$

Namely, it is understood that while the small signal gain G varies with the condition variation, the limiter amplitude $V_{lm}$ is kept constant. This kind of current source is often used as a bias for the last staged differential pair (slicer circuit) of an analog amplifier since it keeps the output signal amplitude constant.

The current source ③ shown in FIG. 10 for suppressing a small signal gain variation in an amplifier having a resistance load type differential pair will now be described. In Eq. (2), suppressing the variation of the small signal gain G can require the current value $I_s$ of the bias current source to vary in proportion to $1/R^2$ and $1/\beta$ to cancel the variations of R and $\beta$. In FIG. 10, it is supposed that a suppressing transistor M32 has a gate whose width is "N" times as wide as that of a suppressing transistor M31, while otherwise both are the same. At this time, currents $I_{31}$ and $I_{32}$ which respectively flow through the transistors M31 and M32 are approximately expressed as the following equations:

$$I_{31} = (\beta/2) \times (Vgs_{31} - Vt)^2 \qquad \text{Eq. (15)}$$

$$I_{32} = (N\beta/2) \times (Vgs_{32} - Vt)^2 \qquad \text{Eq. (16)}$$

[$Vgs_{31}$, $Vgs_{32}$: voltages between the gate and source of M31 and M32,

Vt: threshold value of CMOS transistor]

Potentials at points A and B in FIG. 10 are dropped to an appropriate voltage through a source follower 11 composed of transistors M3–M10 including a current mirror CM32 and controlled to be mutually equal by an operational amplifier OA3 and transistors M31–M34. Since a potential difference between $Vgs_{31}$ and $Vgs_{32}$ is applied across the ends of a suppressing resistor r4 (resistance r), the following equation can be obtained.

$$Vgs_{31} - Vgs_{32} = r \times I_{32} \times \sqrt{(2I_{31}/\beta)} - \sqrt{\{2I_{32}/(N\beta)\}} \qquad \text{Eq. (17)}$$

Also, since the points A and B have the same potential, the currents $I_{31}$ and $I_{32}$ which respectively flow through R31 and R32 of the same resistance have the same value. Accordingly, a current $I_{33}$ flowing through a current source transistor M33 is expressed with a calculation constant $k_1$, a variation component of the resistance r of the resistor r4, and a variation component of the gain coefficient $\beta$ using Eq. (17) as given by the following equation: (It is to be noted that another solution of Eq. (17), which is $I_{33}=0$, lets a start-up circuit 10 composed of transistors M35 and M36 flow a start-up current $I_{ST}$ through the transistors M35 and M36 by a current mirror CM31, thereby prohibiting the state where no current flows through the suppressing transistors M31 and M32.)

$$I_{33}=I_{31}+I_{32}(=2I_{32})=((4/(r^2\beta))(1-1/\sqrt{N})^2=k_1/\{R_{typ}^2(1\pm\Delta_r)^2\times\beta_{typ}(1\pm\Delta_B)\} \qquad \text{Eq. (18)}$$

Accordingly, the current expressed by Eq. (18) varying in proportion to $1/R^2$ and $1/\beta$ is used as a bias current $I_g$ for a differential amplifier (not shown) by a current mirror (a current mirror CM33 having a ratio $k_2$ and composed of the operational amplifier OA3 and transistors M31–M34, M37, and M38) given by the following equation:

$$I_g=k_2\times I_{33}=I_s/\{(1\pm\Delta_r)^2\times(1\pm\Delta_B)\} \qquad \text{Eq. (19)}$$

$$[I_s=4(1-1/\sqrt{N})^2/\{r_{typ}^2\times\beta_{typ}\}=\text{constant}]$$

Thus, the small signal gain G and the limiter amplitude $V_{lm}$ are respectively expressed by the following equations from Eqs. (2) and (3):

$$G=R\times\sqrt{\beta}\times\sqrt{I_g}=G_{typ}(=\text{constant}) \qquad \text{Eq. (20)}$$

$$[G_{typ}=R_{typ}\times\sqrt{\beta_{typ}}\times\sqrt{I_s}=\text{constant}]$$

$$V_{lm}=R\times I_g=V_{typ}/\{(1\pm\Delta_r)\times(1\pm\Delta_B)\} \qquad \text{Eq. (21)}$$

$$[V_{typ}=R_{typ}\times I_s=\text{constant}]$$

Namely, while the limiter amplitude $V_{lm}$ varies with condition variations, the small signal gain G is kept constant. Moreover, since Eqs. (19)–(21) include no element depending on the source, no dependency on a source voltage arises as long as the operational amplifier OA3 or the like has a range of source voltage where a normal operation is enabled.

It is to be noted that since the arrangement example of FIG. 10 performs a suppression of variation for an N-type differential pair, a suppression of variation for a P-type differential pair can be performed in the same arrangement by replacing the N-type transistor with the P-type, the source with the earth, the earth with the source, and the like.

A resistance load type differential pair using this kind of current source as a bias circuit can provide a linear output amplitude in response to an input amplitude even under the conditions varying. Therefore, it is frequently used in a circuit, where an analog linear amplification of a small signal is regarded as important, such as a circuit for performing a separation of S/N (Signal/Noise), i.e. a comparison of a constant identification potential with a signal amplitude of $V_{in\text{-}pp}\times G$ after the amplification.

It is important for such an analog integrated circuit design to fulfill the following requirements:
Requirement 1:
Low voltage operation (minute machining of manufacturing process)
Requirement 2:
High speed operation (enhancement of signal band)

Concerning the "Requirement 1", as the minute machining of IC's or LSI's has made a further progress in recent years for the purpose of the cost reduction, the source voltage of an integrated circuit has been reduced than before to the extent of e.g. 3V. Although being preferable from a viewpoint of low power consumption, this has resulted in much burden to the direct current design not requiring much consideration therefor.

As an example, this has become remarkable especially in case of an analog linear amplification. In the analog linear amplification, it is important for the purpose of suppressing the signal deterioration caused by wave distortions and the like to use all of the transistors composing the differential pair in the saturating operation, that is to use them over a range of voltage between the drain and the source where the variation of the current therebetween the drain and the source is extremely small with respect to the variation of the voltage Vds therebetween in case of CMOS transistors.

The direct current designs for the resistance load type differential pair are applied to the differential pair itself and the input/output levels of the differential pair.

This will be described hereinafter referring to FIG. 11. Firstly, the following equation is given for the differential pair itself.

$$V_{dd}(\text{source voltage})\geq R\times I_s+V_{ds\text{-}min}(\text{differential pair})+V_{ds\text{-}min}(\text{bias source}) \qquad \text{Eq. (22)}$$

[$V_{ds\text{-}min}$: minimum required voltage between drain and source for saturating operation]

Moreover, a relation of the following equation is required for an input signal level of differential pairs 41 and 43.

$$V_{in\text{-}min}(\text{minimum signal input voltage})\geq V_t(\text{differential pair})+V_{ds\text{-}min}(\text{bias source}) \qquad \text{Eq. (23)}$$

[$V_t$: threshold potential of transistor]

In the above Eq. (23), the purpose of considering $V_t$ of the differential pair is to suppress the wave distortions by realizing an instantaneous output response to an input since little current flows through the transistor at the voltage of $V_t$ or below.

Also, concerning the minimum signal input voltage $V_{in\text{-}min}$, an amplifier often employs multi-staged differential pairs 41 and 43 as shown in FIG. 11 which are mutually connected with a buffer such as a source follower 45 or an emitter follower. Accordingly, an input level between each differential pair (differential pair 43) after the first stage is expressed by the following equation:

$$V_{in\text{-}min}=V_{dd}-R\times I_s-V_{gs}(\text{output voltage drop of source follower}) \qquad \text{Eq. (24)}$$

Accordingly, the following equation is given by substituting Eq. (23) for Eq. (24).

$$V_{dd}-R\times I_s\times V_{gs}(\text{source follower})\geq V_t(\text{differential pair})+V_{ds\text{-}min}(\text{bias source}) \quad V_{dd}\geq R\times I_s+V_{gs}(\text{source follower})+V_t(\text{differential pair})+V_{ds\text{-}min}(\text{bias source}) \qquad \text{Eq. (25)}$$

Accordingly, since the "Requirement 1" means that the upper limit $V_{dd}$ becomes low in Eqs. (22) and (25) expressing the conditions for the direct current design, the limiter amplitude $R\times I_s$ (see Eq. (3)) is restricted in Eq. (25), thereby making the direct current design difficult.

Also, the enhancement of the signal band in the "Requirement 2" requires improvements of the output signal band determined by the load resistance R and a parasitic capacitance C of the transistors composing the differential pairs 41 and 43, and of the through-rate determined by the next stage input load such as a gate capacitance with respect to a driving ability (bias current amount) of the differential pairs 41 and 43.

This means, in the circuit design, the increase of the bias current and the decrease in size of the transistors composing the differential pair, that is the increase of a current density between the drain and the source leads to the increase of the minimum potential $V_{ds\text{-}min}$ between the drain and the source required for the saturating operation, so that the limiter amplitude $R\times I_s$ shown in Eq. (3) is also restricted in Eq. (25), thereby making the direct current design difficult.

Examples of general numerical values in Eq. (25) for a CMOS manufacturing process are shown in the following Table 1.

TABLE 1

Numerical value examples for CMOS manufacturing process

| ITEM | SYMBOL | VOLTAGE (V) | REMARKS |
| --- | --- | --- | --- |
| SOURCE VOLTAGE | $V_{dd}$ | 3.0–5.0 | 3 V IN GENERAL |
| THRESHOLD VOLTAGE | $V_t$ | 0.5–1.0 | PROCESS MINIMUM MEASUREMENT |
| SATURATED DRAIN SOURCE POTENTIAL | $V_{ds\text{-}min}$ | DESIGNED TO BE 1.0 OR BELOW | DEPENDENT ON CURRENT DENSITY |

According to Table 1, supposing $V_{dd}$=3V, $V_{gs}-V_t$=0.8V and $V_{ds\text{-}min}$=0.4V in Eq. (25), the limiter amplitude R×$I_s$ requires to be 1V or less including the variation.

Accordingly, the limiter amplitudes will now be considered in case the current sources ①–③ shown in FIGS. 8–10 are used for a bias current $I_s$ of the differential pairs 41 shown in FIG. 11. Particularly for the analog linear amplification, it is important to enlarge the limiter amplitude in respect of securing the input dynamic range.

In the prior art shown in FIGS. 8–10, except for the contents to be suppressed as the objects of the current source in use, the values thereof vary greatly with the variations of the circumferential and manufacturing process conditions (variations of $\Delta_r$ and $\Delta_B$).

The variation tendencies can be calculated by Eqs. (8), (9), (13), (14), (20), and (21) as shown in the following Table 2. Also, FIG. 12 shows a small signal gain variation characteristic as the resistance R is varied, FIG. 13 shows a small signal gain variation characteristic as the gain coefficient β is varied, FIG. 14 shows a limiter amplitude variation characteristic as the resistance R is varied, and FIG. 15 shows a limiter amplitude variation characteristic as the gain coefficient β is varied.

TABLE 2

$\Delta_r$ and $\Delta_B$ dependencies of small signal gain and limiter amplitude by current source types

| CURRENT SOURCE TYPE | SMALL SIGNAL GAIN VARIATION: $G/G_{typ}$ | LIMITER AMPLITUDE VARIATION: $V/V_{typ}$ |
| --- | --- | --- |
| CURRENT VARIATION SUPPRESSING TYPE ① | $(1 \pm \Delta_r) \times (1 \pm \Delta_b)^{0.5}$ | $1 \pm \Delta_r$ |
| RESISTANCE VARIATION SUPPRESSING TYPE ② | $(1 \pm \Delta_r)^{0.5} \times (1 \pm \Delta_B)^{0.5}$ | 1 |
| GAIN VARIATION SUPPRESSING TYPE ③ | 1 | $1/[(1 \pm \Delta_r) \times (1 \pm \Delta_B)]$ |

From the above, in the direct current design considering the variations of the circumferential and manufacturing process conditions, the maximum limiter amplitude at the time of condition variations is supposed to be R×$I_s$ in Eq. (25) as described above so that the limiter amplitude under the typical condition is made small by the amount of variation. Accordingly, it is found that the largest limiter amplitude can be secured when the resistance variation suppressing type current source ② without limiter amplitude variations is used as the bias for the differential pair.

However, as described above, since the analog linear amplification has often an object of the separation of S/N or a faithful reproduction of the input, it is also important to suppress the small signal gain variation.

However, as shown in Table 2 and FIGS. 10–13, in case the current sources are independently used, it is not possible to suppress both of the small signal gain variation and the limiter amplitude variation, or to satisfy $G/G_{typ}$=1 and $V/V_{typ}$=1 at the same time against the variations of the circumferential and manufacturing process conditions. Therefore, it is to be urged to select an extreme improvement of one of the variations while worsening the variation of the other.

It has been possible in the prior art to secure the limiter amplitude even if the gain variation suppressing type current source ③ is solely used since the source voltage in use has been relatively high to the extent of 5V allowing a margin for the direct current design.

In a general circuit design, allowable values for design parameters are determined according to specification or the like. Also, in an amplifier design, an allowable gain variation $\Delta_{pg}$ and an allowable limiter amplitude variation $\Delta_{pl}$ can be calculated according to the design specification or the like, the allowable values depending on the place and object of the circuit.

If the current sources for different objects to be suppressed are independently used as in prior art, even though one of the variations of the gain and the limiter amplitude caused by the condition variations may have a margin with respect to the corresponding allowable variation, the other may not, which leads to the failure of the design proper.

As described above, in the design of the differential pair for the analog linear amplifier where the current sources for different objects to be suppressed, i.e. the limiter amplitude or the small signal gain, are independently used as in the prior art, there is a problem that it has become difficult to deal with the reduction of the source voltage following the minute machining of integrated circuits, the speedup of circuit operations, and the variations of circumferential and manufacturing process conditions in recent years, while enabling both of the design for suppressing the gain variation and the direct current design for securing the input dynamic range (limiter amplitude).

SUMMARY OF THE INVENTION

It is accordingly an object of the present invention to provide an amplifier having a differential pair of an integrated resistance load type with a bias current source suppressing a gain variation and a limiter amplitude (or direct current level) variation caused by variations of circumferential conditions such as a temperature and source voltage, manufacturing process conditions, and the like.

In the differential amplifier according to the present invention, a bias current $I_g$ for suppressing the gain variation of a resistance load type differential pair against the variations of the circumferential and manufacturing process conditions and a bias current $I_r$ for suppressing an output limiter amplitude variation against the variations of conditions as described above are mixed at a constant ratio in consideration of an allowable gain variation $\Delta_{pg}$ and an allowable limiter amplitude variation $\Delta_{pl}$ calculated from a design specification or the like under a circumferential condition which is most frequently used and a manufacturing process condition which is best achieved (typical condition) to obtain a current $I_m$ which is reproduced using a current mirror or the like. The reproduced current is used as a bias current $I_s$ of the resistance load type differential amplifier.

This enables, without extremely improving one of the variations while worsening the other as in the prior art, an appropriate distribution of variations to be performed corresponding to each allowable value and both of the gain design and the direct current design for the resistance load type differential pair to be compatible.

Namely, supposing that the ratio of the bias current $I_r$ for suppressing the limiter amplitude variation to the bias current $I_g$ for suppressing the small signal gain variation against the variations of the circumferential and manufacturing process conditions is $\alpha$: $1-\alpha$ where $0<\alpha<1$ under the typical condition, the mixed current $I_m$ can be expressed by the following equation by using Eqs. (12) and (19):

$$I_m=\alpha I_r+(1-\alpha)I_g=I_s[\alpha/(1\pm\Delta_r)+(1-\alpha)/\{(1\pm\Delta_r)^2\times(1\pm\Delta_B)\}] \quad \text{Eq. (26)}$$

It is to be noted that "$\alpha=1$" corresponds to a case where the limiter amplitude variation suppressing current is solely used while "$\alpha=0$" corresponds to a case where the small signal gain variation suppressing current is solely used.

The current of this Eq. (26) is provided as a bias current source of the resistance load type differential pair. Since the small signal gain G and the limiter amplitude $V_{lm}$ under the varying conditions are given by Eqs. (6) and (7), when the current $I_m$ of Eq. (26) is applied to them, the small signal gain variation and the limiter amplitude variation are respectively given by the following Eqs. (27) and (28):

$$G/G_{typ}=1\pm\Delta_G=[\alpha\times(1\pm\Delta_r)\times(1\pm\Delta_B)+(1-\alpha)]^{0.5} \quad \text{Eq. (27)}$$

$[G_{typ}=R_{typ}\times\sqrt{\beta_{typ}}\times\sqrt{I_s}=\text{constant}, \Delta_G$: small signal gain variation]

$$V/V_{typ}=1\pm\Delta_{Vl}=[\alpha+(1-\alpha)/\{(1\pm\Delta r)\times(1\pm\Delta B)\}] \quad \text{Eq. (28)}$$

$[V_{typ}=R_{typ}\times I_s, \Delta_{Vl}$: limiter amplitude variation]

In the above-mentioned Eqs. (27) and (28), if the value of $\alpha$ is determined so that the small signal gain variation $\Delta_G$ and the limiter amplitude variation $\Delta_{Vl}$ may respectively satisfy the allowable gain variation $\Delta_{pg}$ and the allowable limiter amplitude variation $\Delta_{pl}$, both of the gain design and the direct current design of the resistance load type differential pair are made compatible.

It is to be noted that the above-mentioned resistance load type differential pair may have cascode transistors between load resistors and transistors composing the differential pair.

Also, the present invention may comprise a second resistance load type differential pair for inputting the output of the above-mentioned differential pair preferably through a source follower or an emitter follower and may use, as a bias current source of the second differential pair, a resistance variation suppressing type current source for generating a constant current which varies to suppress the limiter amplitude variation.

Also, the current output terminals of the other differential pair may be mutually connected with a resistor.

The present invention may further comprise a peak and a bottom detector which respectively detect a peak and a bottom value of an input signal, and a voltage divider which divides the output voltages of both detectors to generate a threshold signal, wherein the input signal and the threshold signal are given to the differential pair at the first stage.

Moreover, the transistors composing the current mirror may have cascode transistors.

BRIEF DESCRIPTION OF THE DRAWINGS

Throughout the figures, the same reference numerals indicate identical or corresponding portions.

DESCRIPTION OF THE EMBODIMENTS

Figure 1:
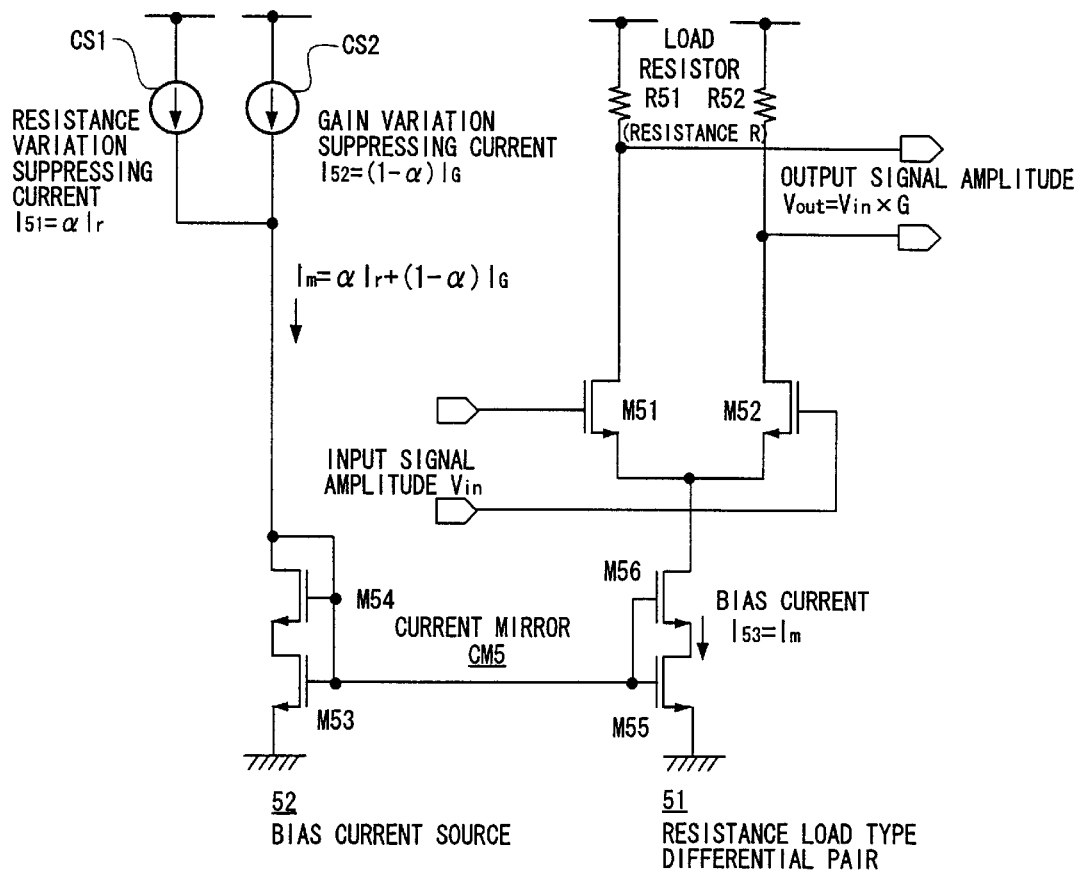
FIG. 1 is a circuit diagram illustrating an embodiment (1) of a differential amplifier according to the present invention.

FIG. 1 shows an embodiment (1) of a differential amplifier according to the present invention. In this embodiment, a resistance variation suppressing current source CS1 and a gain variation suppressing current source CS2 are connected in parallel and a current mirror CM5 is used as a bias current source 52 for providing a bias current $I_{53}$ to a differential pair 51 which is composed of transistors M51 and M52 by reproducing a mixed current $I_m$ of both current sources CS1 and CS2 expressed by the above-mentioned Eq. (26). This current mirror CM5 has cascode transistors M54 and M56 respectively added to transistors M53 and M55.

Figure 9:
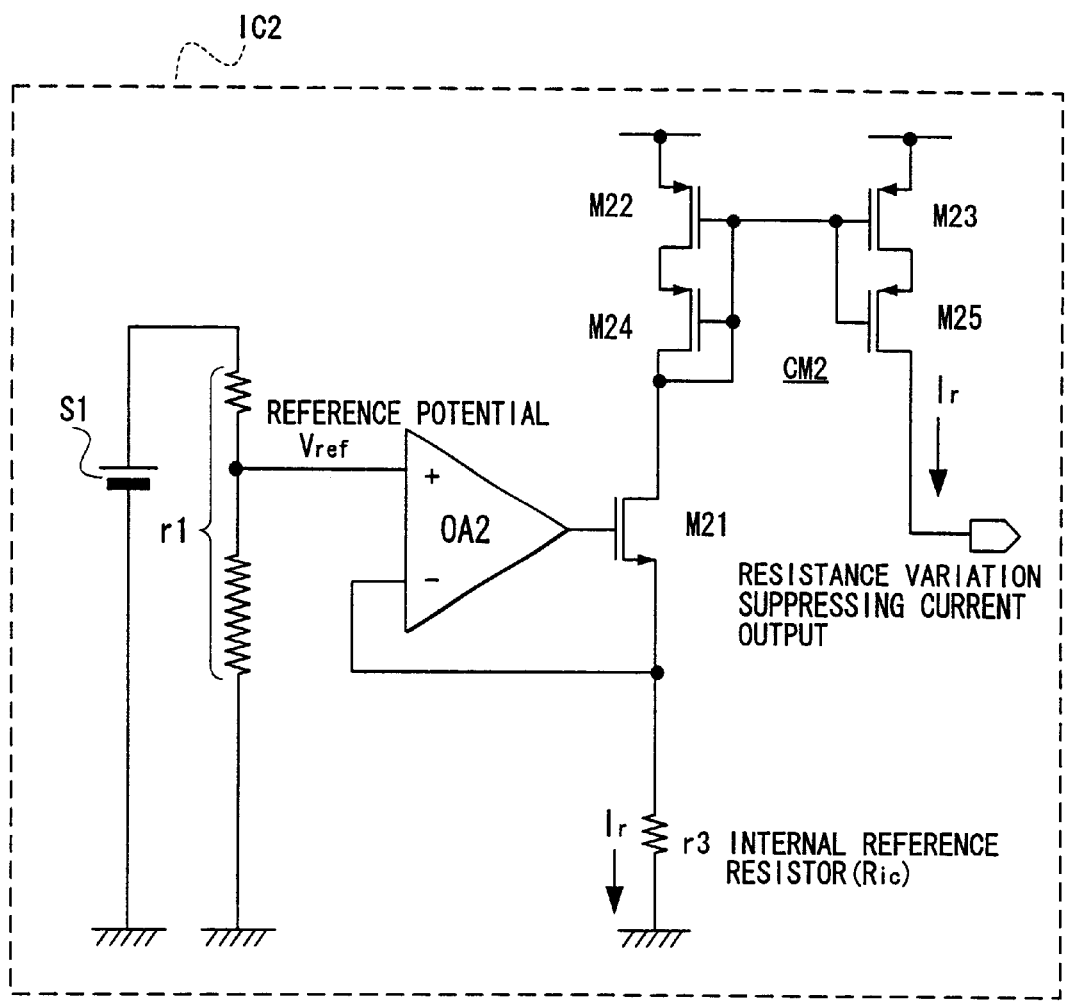
FIG. 9 is a circuit diagram illustrating a prior art current source of a resistance variation suppressing type.
Figure 10:
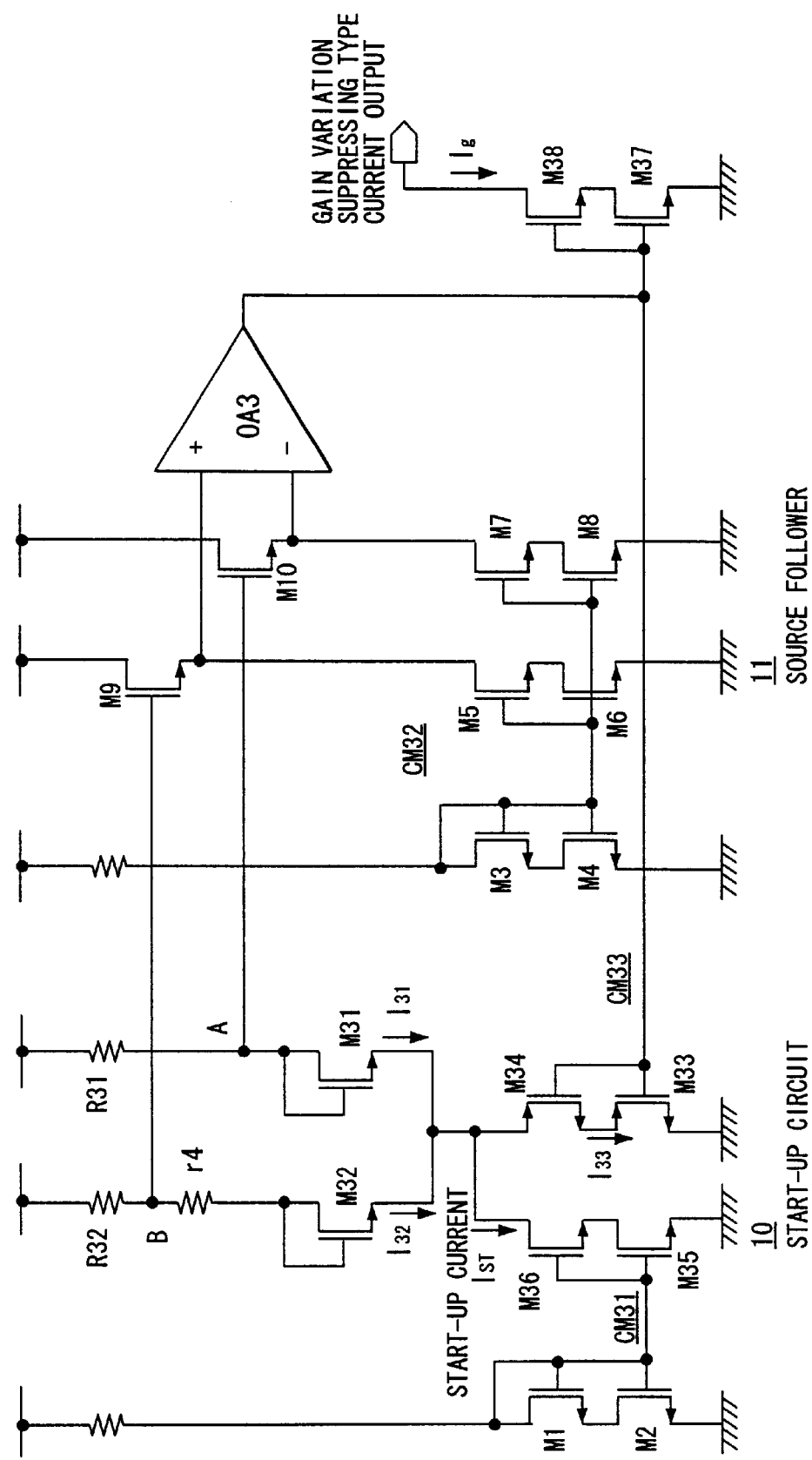
FIG. 10 is a circuit diagram illustrating a prior art current source of a gain variation suppressing type.

This embodiment adopts, as described above, a value of $\alpha$ which is selected so that the small signal gain variation $\Delta_G$ and the limiter amplitude variation $\Delta_{Vl}$ in Eqs. (27) and (28) may respectively satisfy the allowable gain variation $\Delta_{pg}$ and the allowable limiter amplitude variation $\Delta_{pl}$ and a design value $I_s$ for a bias current $I_{53}$ of an amplifier having a resistance load type differential pair under a typical condition. Currents $I_{51}$ and $I_{52}$ from the reference current sources CS1 and CS2 respectively shown in FIGS. 9 and 10 are mixed to be provided to the current mirror CM5 so that the bias current $I_{52}$ suppressing the gain variation may amount to "$(1\times\alpha)\times I_s$" and the bias current $I_{51}$ suppressing the limiter amplitude variation may amount to "$\alpha\times I_s$" under the typical condition ($I_g=I_r=I_s$).

Specifically in this embodiment, when $\Delta_r$ and $\Delta_B$ are considered to be independent in the above-mentioned Eqs. (13), (14), (20), (21), (27), and (28), a small signal gain variation is shown in FIG. 2 and a limiter amplitude variation is shown in FIG. 3 for a resistance variation × gain coefficient variation $\Delta_{rB}$ which can be regarded as:

$$1 \pm \Delta_{rB} = (1 \pm \Delta_r) \times (1 \pm \Delta_B) \qquad \text{Eq. (29)}$$

Figure 2:
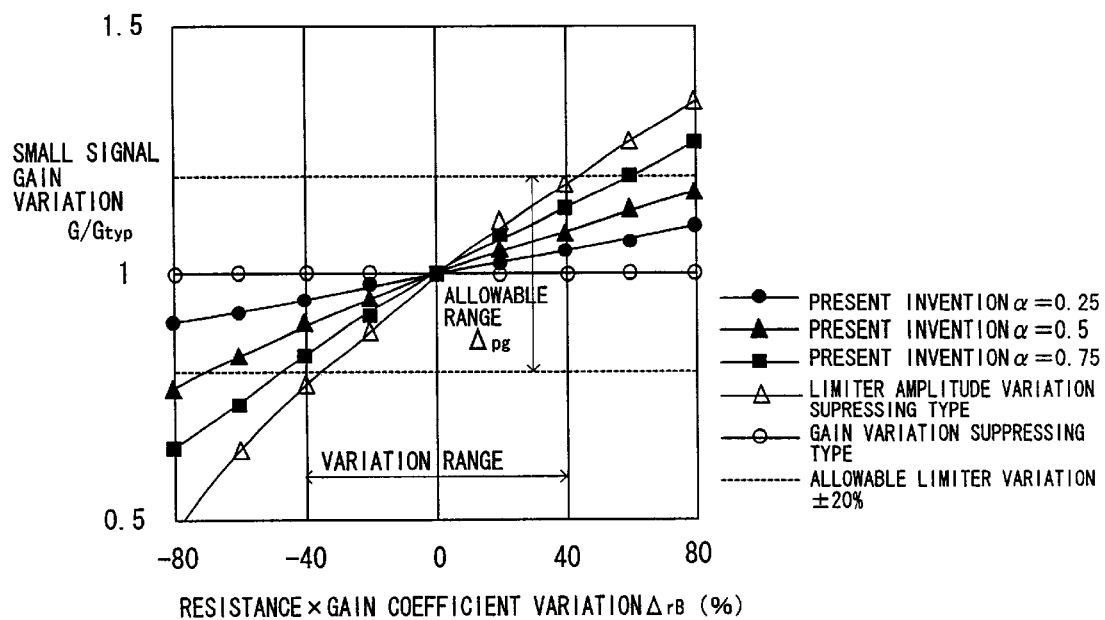
FIG. 2 is a graph illustrating a small signal gain variation characteristic versus resistance × gain coefficient variation of a differential amplifier according to the present invention.
Figure 3:
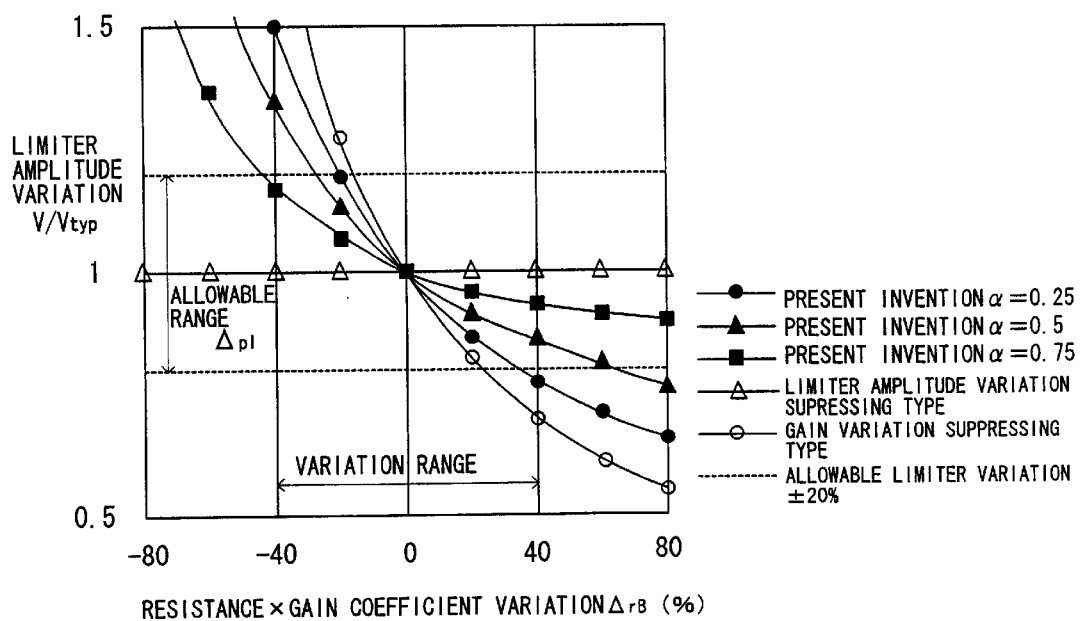
FIG. 3 is a graph illustrating a limiter amplitude variation characteristic versus resistance × gain coefficient variation in a differential amplifier according to the present invention.

Supposing that the resistance variation × gain coefficient variation $\Delta_{rB}$ is +40% and both of the allowable gain variation $\Delta_{pg}$ and the allowable limiter amplitude variation $\Delta_{pl}$ are ±20% as shown by dotted lines in FIGS. 2 and 3, when the current sources for different objects to be suppressed (the limiter amplitude or the small signal gain) are solely used as marked with symbols Δ and ○ in FIGS. 2 and 3, neither satisfies both of the allowable values at the same time. However, in this embodiment, although both of the allowable variations $\Delta_{pg}$ and $\Delta_{pl}$ cannot be satisfied at the same time when α=0.25 as marked with a symbol ● and α=0.5 as marked with a symbol ▲, it is found that both of the allowable values are satisfied at the same time by setting α=0.75 as marked with a symbol ■, thereby enabling both of the gain design and the direct current design to be compatible.

By the above-mentioned arrangement, both of the gain design and the direct current design for the resistance load type differential pair which deals with the variations of conditions are made possible even under a low source voltage.

It is to be noted that the cascode transistors M54 and M56 are used in the current mirror CM5 of this embodiment for improving the accuracy of the current mirror CM5 by suppressing the variations of the drain potentials of the current source transistors M53 and M55 which are in charge of transferring the current in the current mirror CM5.

Especially in a CMOS transistor, since the resistance between the source and the drain is as low as several MΩ's depending on the manufacturing process, a current which flows between the source and the drain is easy to vary as the drain potential varies. However, they are not necessary if the resistance between the source and the drain can be made sufficiently high in the manufacturing process.

Figure 4:
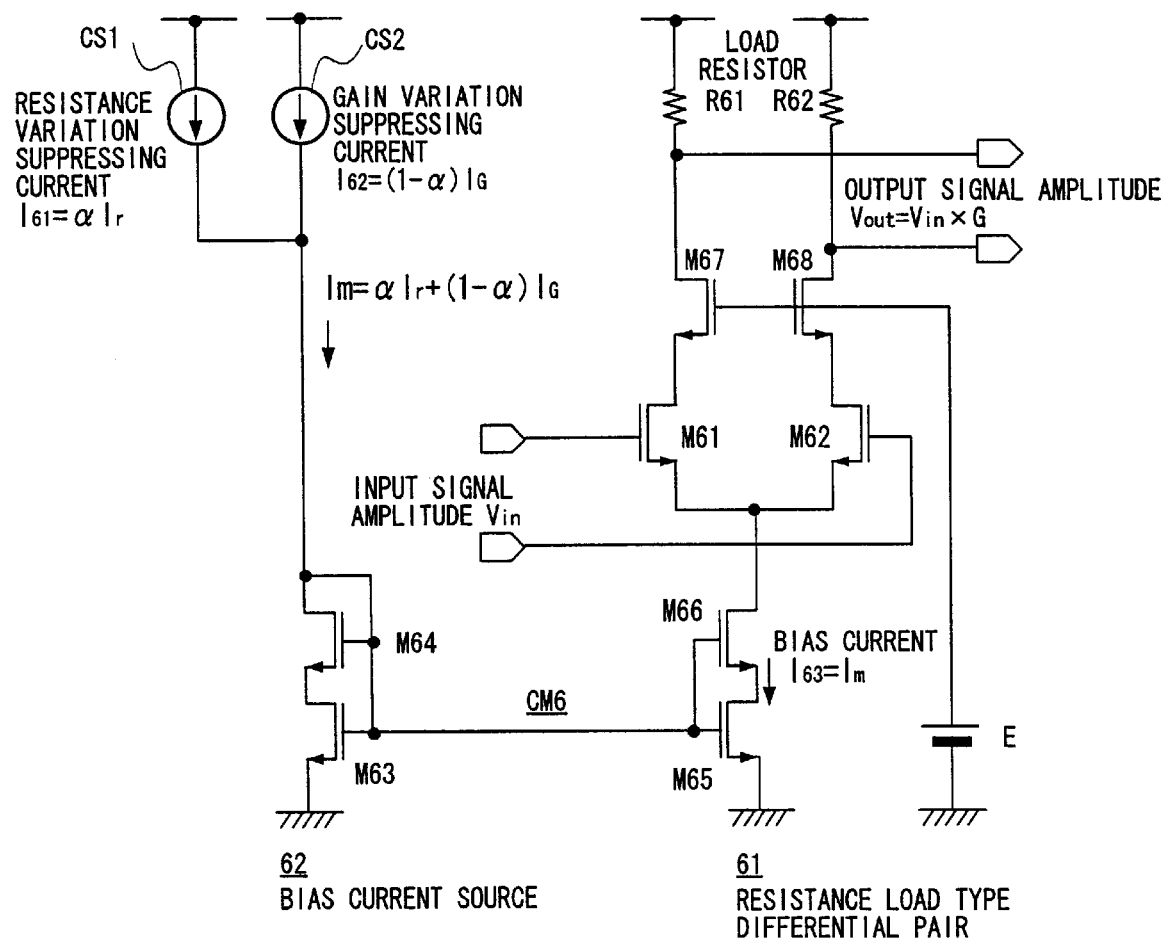
FIG. 4 is a circuit diagram illustrating an embodiment (2) of a differential amplifier according to the present invention.

FIG. 4 shows an embodiment (2) of a differential amplifier according to the present invention. In this embodiment, transistors M61–M66 and load resistors R61, R62 respectively correspond to the transistors M51–M56 and the load resistors R51, R52 in the embodiment (1) of FIG. 1. However, in this embodiment, transistors M67 and M68 having a gate or base grounded are inserted between the load resistors R61, R62 of a differential pair 61 and the differential pair transistors M61, M62 so that parasitic capacitances of the differential pair transistors M61 and M62 are not directly observed from the load resistors R61 and R62, thereby suppressing the band deterioration.

Figure 5:
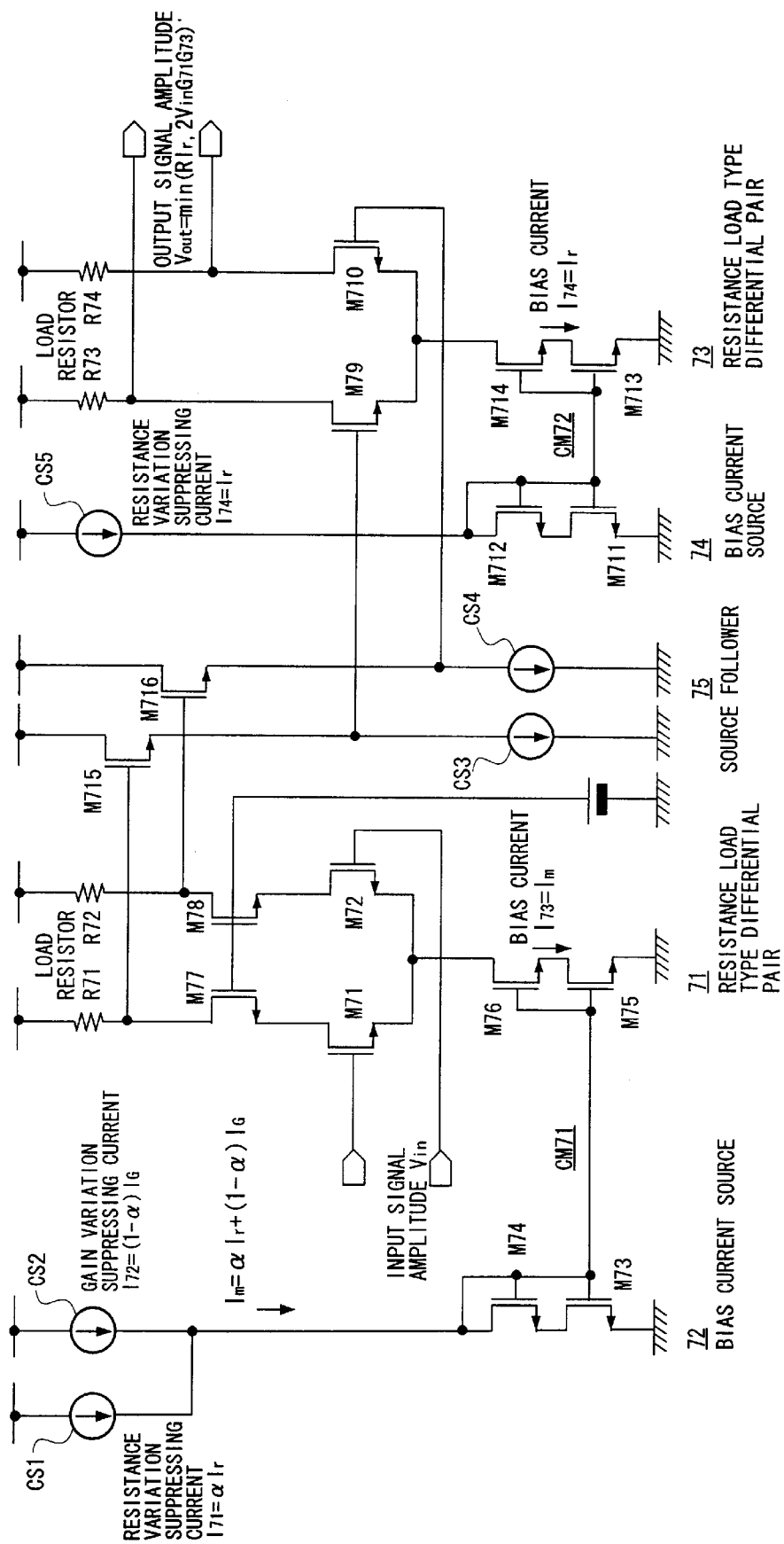
FIG. 5 is a circuit diagram illustrating an embodiment (3) of a differential amplifier according to the present invention.
Figure 11:
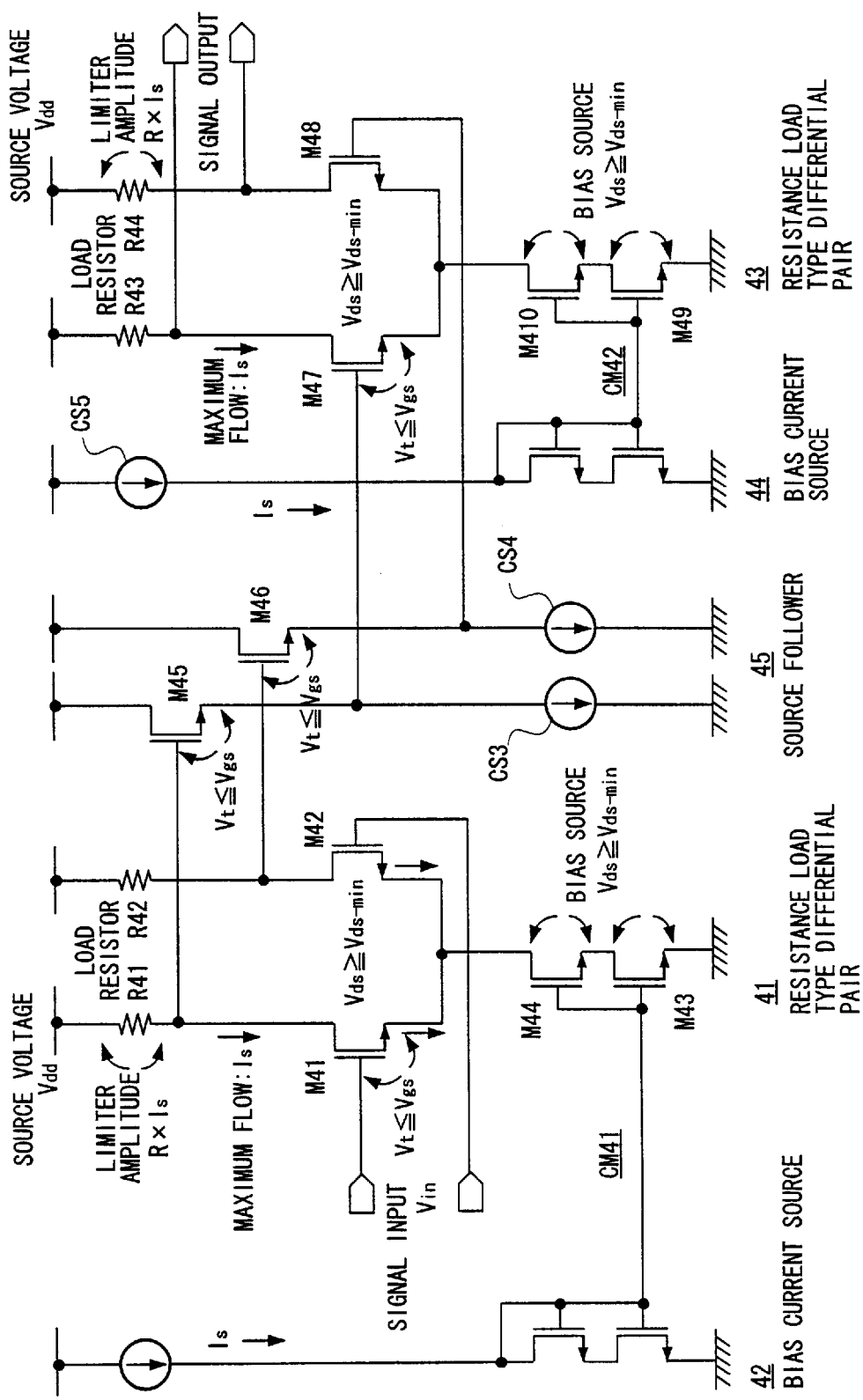
FIG. 11 is a diagram illustrating a circuit example of a prior art differential amplifier of a resistance load type.
Figure 12:
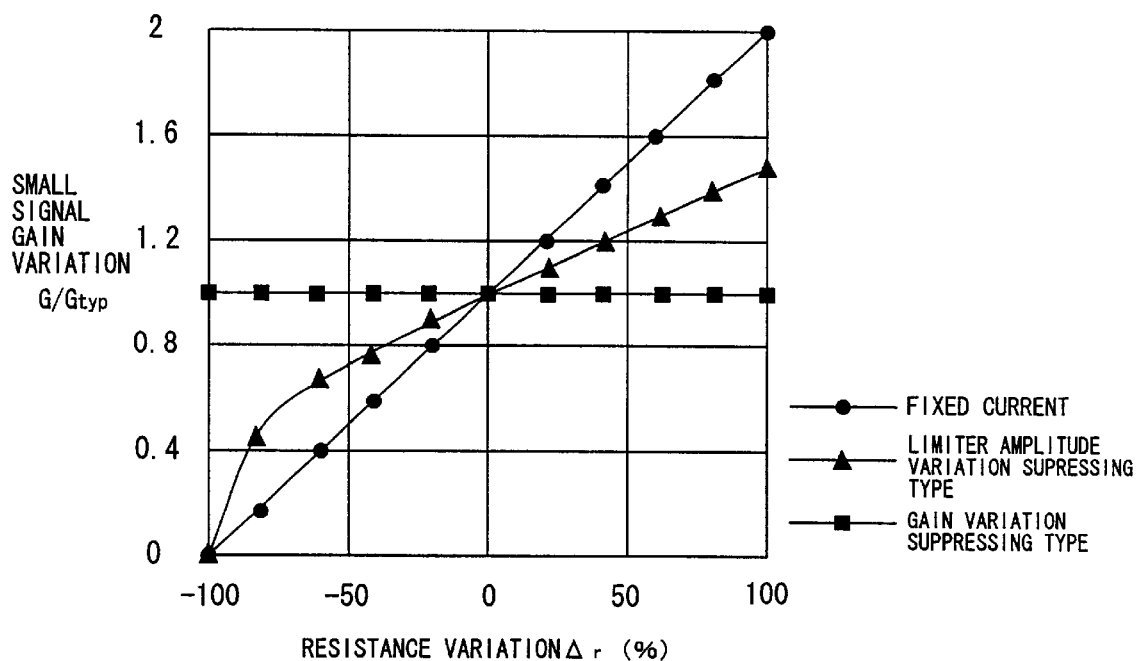
FIG. 12 is a graph illustrating a prior art small signal gain variation characteristic under varying resistance.
Figure 13:
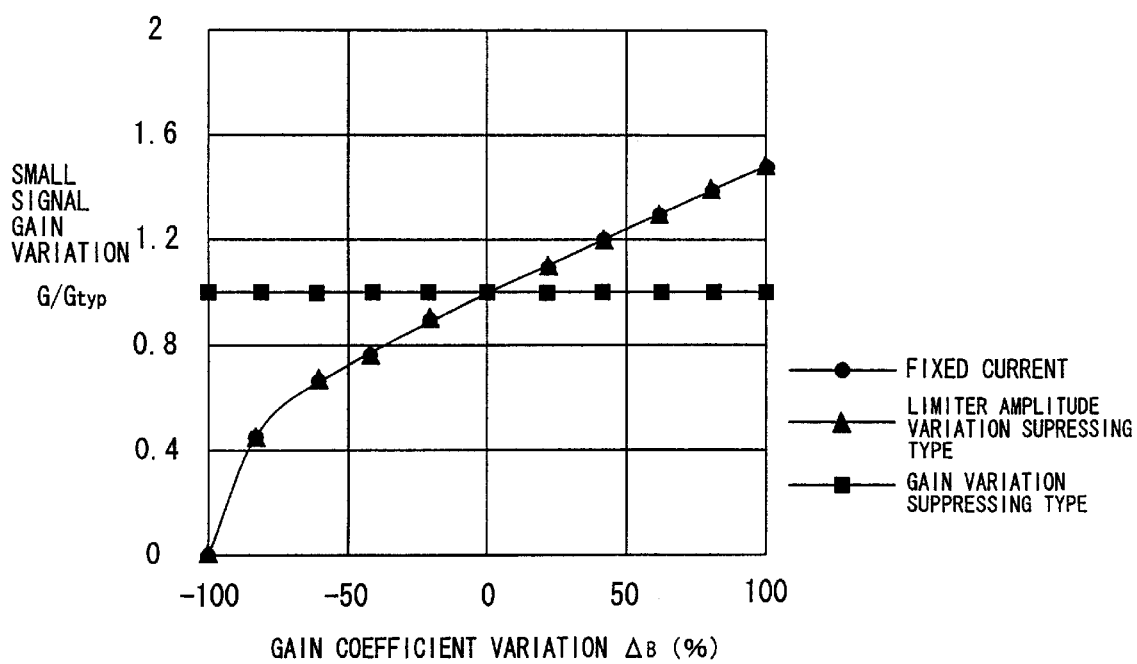
FIG. 13 is a graph illustrating a prior art small signal gain variation characteristic under varying gain coefficient.
Figure 14:
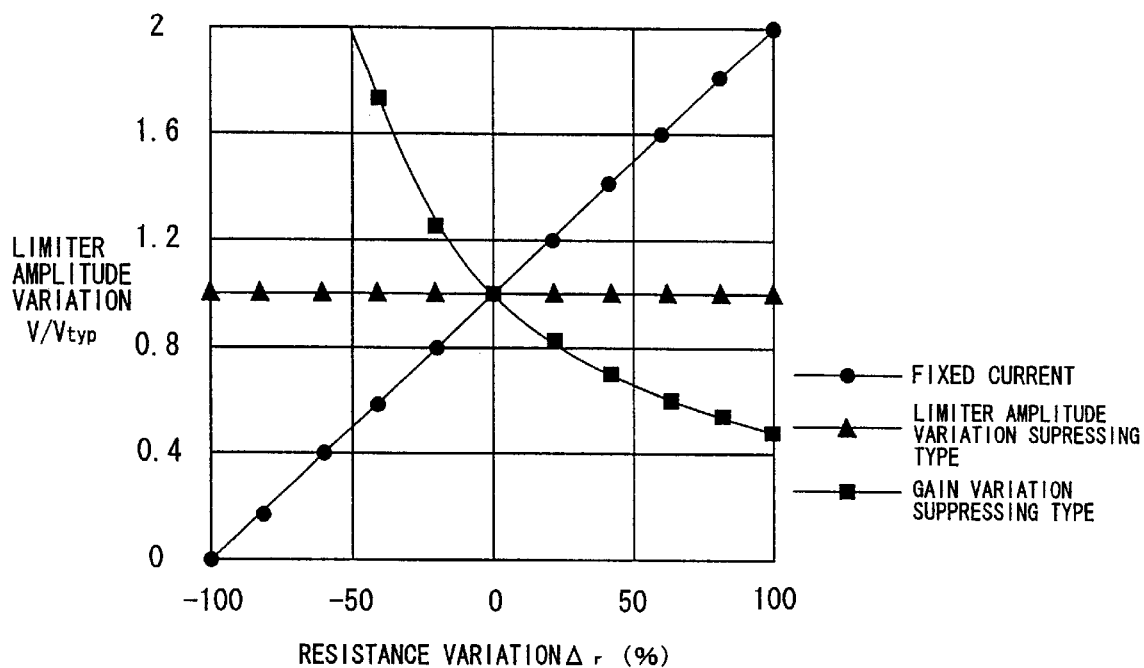
FIG. 14 is a graph illustrating a prior art limiter amplitude variation characteristic under varying resistance.
Figure 15:
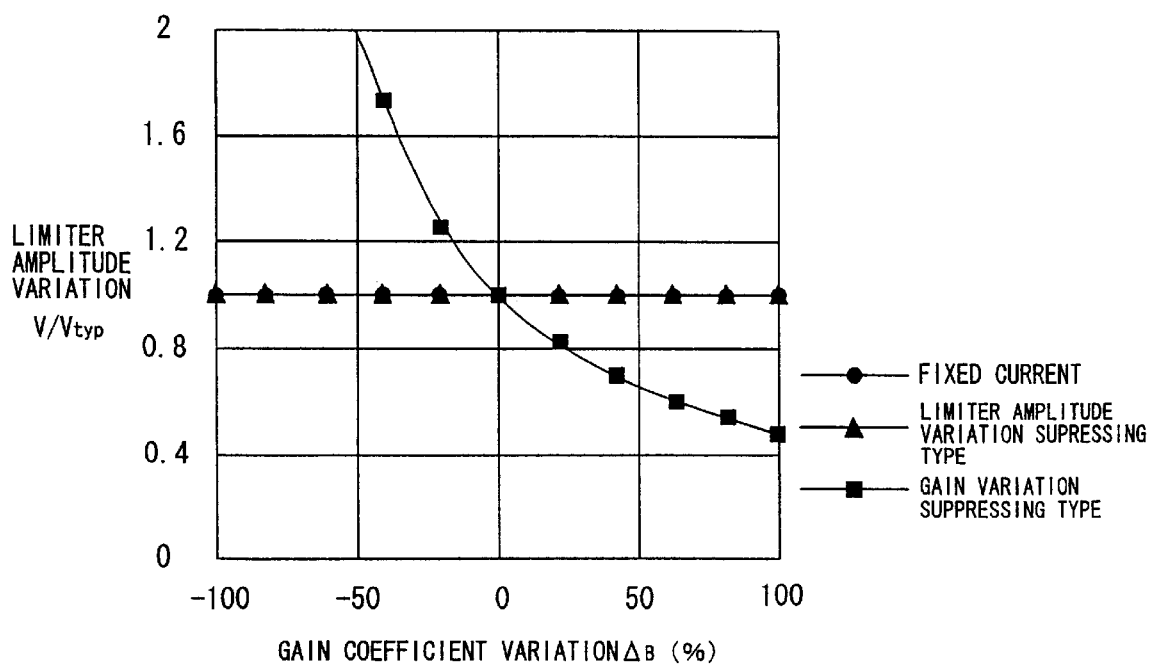
FIG. 15 is a graph illustrating a prior art limiter amplitude variation characteristic under varying gain coefficient.

FIG. 5 shows an embodiment (3) of a differential amplifier according to the present invention. In this embodiment, transistors M71–M78 and load resistors R71, R72 respectively correspond to the transistors M61–M68 and load resistors R61, R62 in the embodiment (2) of FIG. 4. However, in this embodiment, supposing that the differential amplifier is used as a slicer, a differential pair 73 using only a bias current $I_{74}$ by a bias current source 74 for suppressing the resistance variation is connected to the output terminal of the differential pair 71 (61 in the embodiment (2)) through a voltage dropping source (or emitter) follower 75 which is composed of transistors M715, M716 and current sources CS3, CS4 in order to keep an output amplitude (limiter amplitude) constant as in the case of FIG. 11.

The bias current source 74 reproduces the constant current $I_{74}$ at a current mirror CM72 composed of transistors M711–M714 to provide as a bias current $I_r$ for the differential pair 73. A direct current design for an input of the differential pair 73 is given by the above-mentioned Eq. (25). In case the differential pairs are used in the form of multi-stage, such a form is required from the viewpoint of a gain stability and a direct current level setting.

Figure 6:
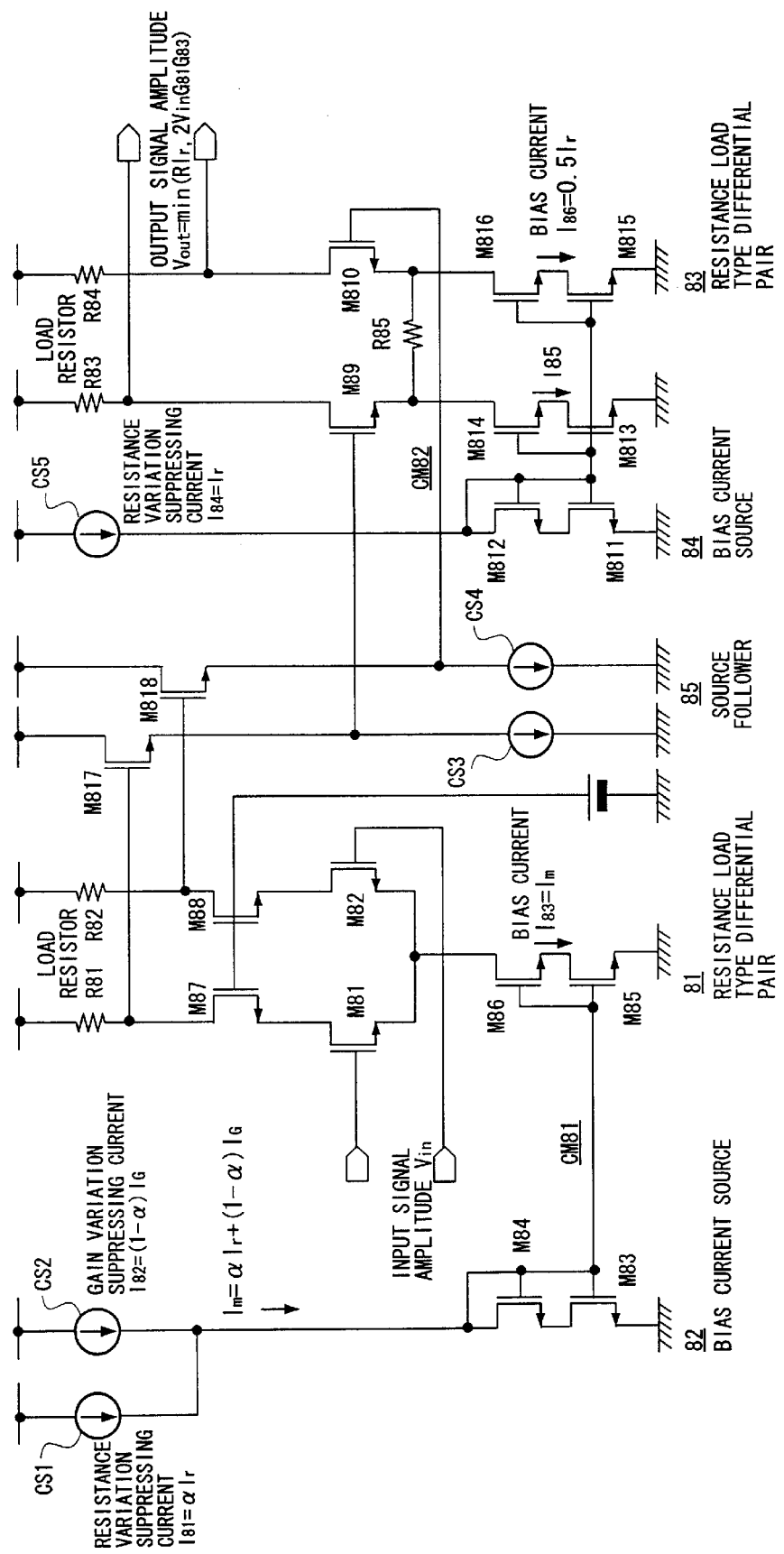
FIG. 6 is a circuit diagram illustrating an embodiment (4) of a differential amplifier according to the present invention.

FIG. 6 shows an embodiment (4) of a differential amplifier according to the present invention. In this embodiment, transistors M81–M89, M810–M814, M817, M818, and load resistors R81–R84 respectively correspond to the transistors M71–M79, M710–M714, M715, M716, and the load resistors R71–R74 in the embodiment (3) of FIG. 5. However, in this embodiment, a source resistor R85 is connected between the source terminals of the transistors M89 and M810 of a differential pair 83, and a bias current $I_{86}(=I_{85})$ is flown though transistors M815 and M816 in parallel with a bias current $I_{85}$ flowing through the transistors M813 and M814 composing a current mirror CM82.

This arrangement realizes the current mirror CM82 providing a half or so of a current source ($I_s/2$) of a conventional differential pair in order that a current value of the transistors M815 and M813 composing a bias current source connected across the ends of the source resistor R85 maintains the output direct current level.

Namely, when using a differential amplifier as a slicer as in the above-mentioned embodiment (3), there is a case where stabilizing the output limiter amplitude is the only object so that while a sufficient gain is obtained solely by a first stage differential pair 81, no gain is desirable to be obtained by a second stage differential pair 83. In this case, since the second stage differential pair 83 obtains a gain of 6dB due to a differential input, the second stage differential pair 83 is required to perform a low gain amplification such as −6 dB by a one-sided input.

A small signal gain $G_s$ of the differential pair 83 with the source resistor used in such an arrangement is expressed by the following equation where the source resistance is $R_s$:

$$G_s = g_m \times R_l / (1 + g_m \times R_s) \qquad \text{Eq. (30)}$$

[$g_m = \sqrt{\beta} \times \sqrt{I_s}$, $R_l$: load resistance, $R_s$: source resistance]

From Eq. (30), it is understood that the small signal gain $G_s$ of the differential pair 83 is determined approximately by a ratio $R_l/R_s$ of the load resistor R83 or R84 to the source resistor R85 when $g_m$ or $R_s$ is sufficiently large whereby a low gain can easily be obtained.

Figure 7:
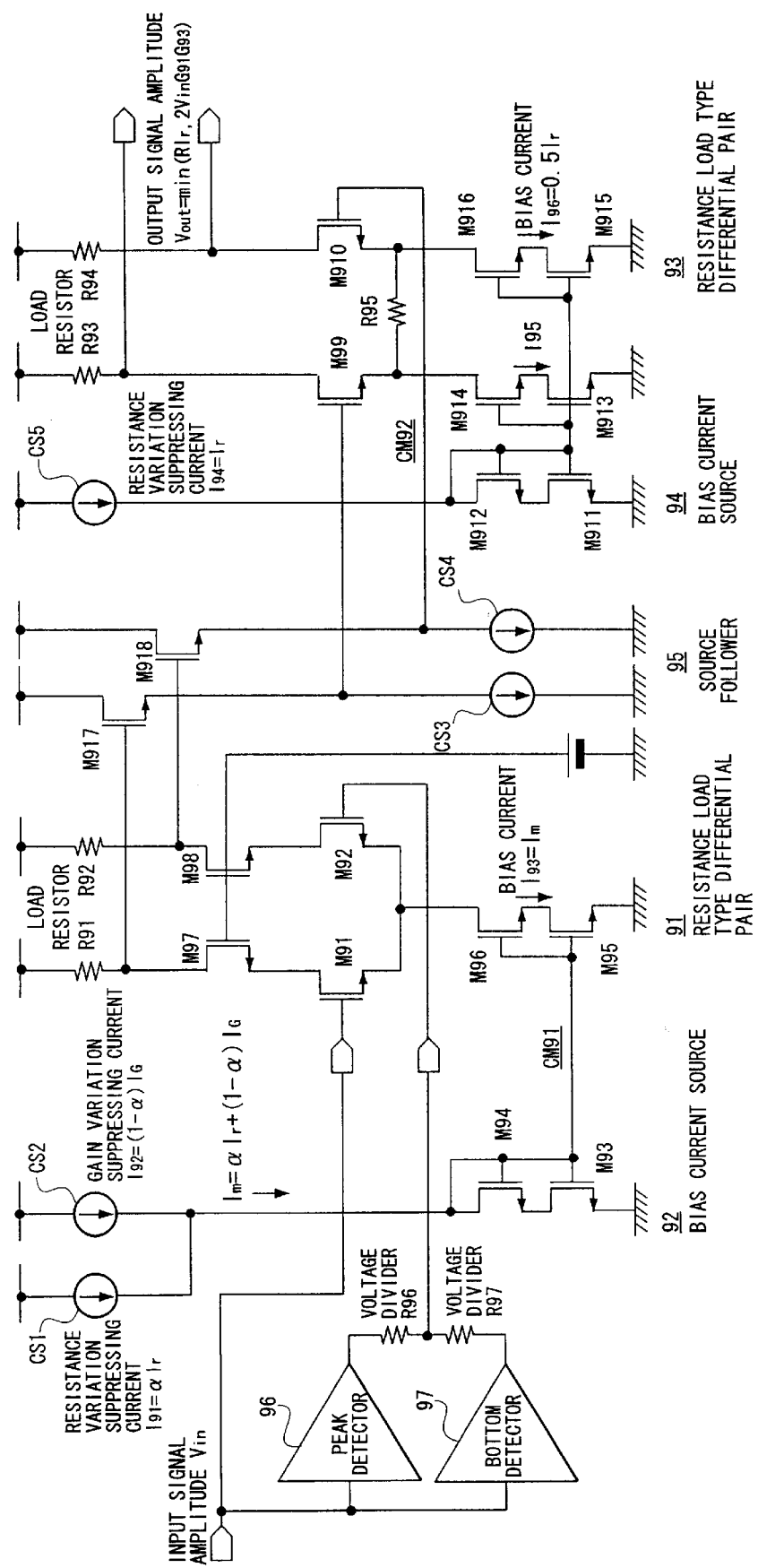
FIG. 7 is a circuit diagram illustrating an embodiment (5) of a differential amplifier according to the present invention.
Figure 8:
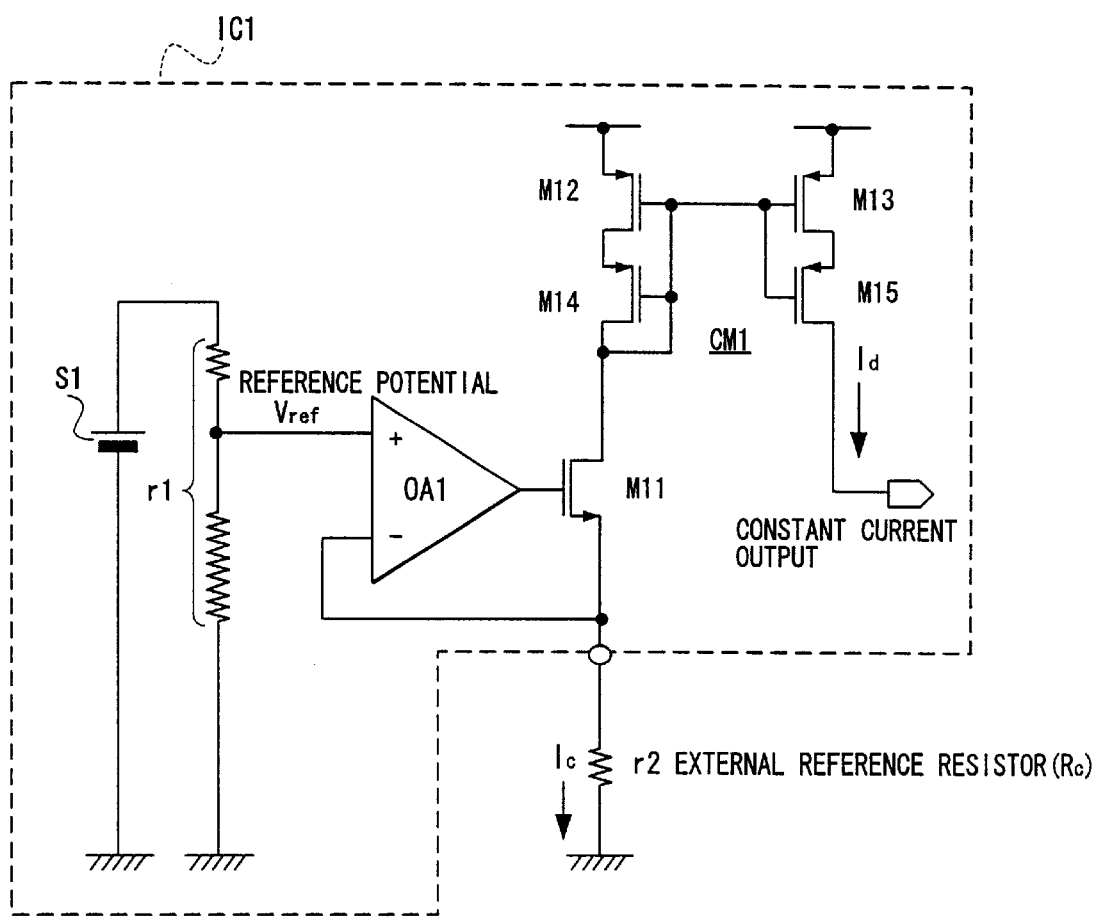
FIG. 8 is a circuit diagram illustrating a prior art constant current source having an external reference resistor.

FIG. 7 shows an embodiment (5) of a differential amplifier according to the present invention. In this embodiment, transistors M91–M99, M910–M918, and load resistors R91–R95 respectively correspond to the transistors transistor M81–M89, M810–M818, and the load resistors R81–R85 in the embodiment (4) of FIG. 6. However, in this embodiment, a peak detector 96 and a bottom detector 97 for an input signal $V_{in}$, as well as voltage dividers R96 and R97 composing a voltage divider portion detect a threshold e.g. a middle value between a peak and bottom value of the input signal in the form of feed forward, and provide the threshold to one input of the first stage differential pair in the above embodiments while providing the same to the other input, for the signal amplification.

Namely, in case of performing a certain type of an identification such as separation of S/N in relation to a signal amplified in the form of feed forward, the gain variation is desirable to be as little as possible within the range of the linear amplification. In this embodiment, by a differential amplification of the input signal based on the threshold detected by the voltage dividers R96 and R97, the gain is decreased for the signal with a high input level and the gain is increased to the contrary for the signal with a low input level, thereby enabling the direct current design under a low voltage while suppressing the gain variation.

It is to be noted that in the above-mentioned embodiments, although CMOS transistors have been used in all the descriptions, the same arrangements are also made possible by bipolar transistors. In addition, although amplifiers have been described as N type, arrangements with P type are also made possible, so that in the embodiments (3) and (4), the combination of N type for the first stage differential pair and P type for the second stage differential pair or vice versa is made possible.

As described above, a differential amplifier according to the present invention is arranged such that a constant current which varies to suppress a small signal gain variation of a resistance load type differential pair caused by variations of circumferential conditions and manufacturing process conditions and a constant current which varies to suppress a limiter amplitude variation of the resistance load type differential pair caused by the variations of the same conditions are mixed at a fixed ratio under a condition which is most frequently used among the circumferential conditions and a condition which is best achieved among the manufacturing process conditions, which is used as a bias current of the differential pair. Therefore, an appropriate distribution of variations becomes possible between the gain variation and the limiter amplitude variation to enable a design of an amplification circuit having a resistance load type differential pair which deals with the variation of conditions even under a low source voltage following a minute machining of integrated circuits in recent years.

What we claim is:

1. A differential amplifier comprising:
   an integrated resistance load type differential pair;
   a gain variation suppressing type current source for generating a first predetermined constant current to suppress a small signal gain variation of the integrated resistance load type differential pair, caused by variations of circumferential conditions and manufacturing process conditions;
   a resistance variation suppressing type current source for generating a second predetermined constant current to suppress a limiter amplitude variation of the integrated resistance load type differential pair, caused by variations of the circumferential conditions and the manufacturing process conditions;
   a mixing means connected to the gain variation suppressing type current source and the resistance variation suppressing type current source for mixing the first and second predetermined constant currents mixed at a constant ratio under a condition most frequently used among the circumferential conditions and best achieved among the manufacturing process conditions, and
   a bias current source connected to the integrated resistance load type differential pair to provide a constant current mixed by the mixing means as a bias current for the integrated resistance load type differential pair.

2. The differential amplifier as claimed in claim 1 wherein the constant ratio is chosen so that the amounts of the small signal gain variation and the limiter amplitude variation simultaneously fall within their allowable ranges.

3. The differential amplifier as claimed in claim 1 wherein the resistance load type differential pair has cascade transistors between load resistors and transistors composing the differential pair.

4. The differential amplifier as claimed in claim 1; further comprising another resistance load type differential pair for inputting an output of the former differential pair, and another resistance variation suppressing type current source for generating a constant current to suppress a limiter amplitude variation of the another resistance load type differential pair and connected to be used as the bias current source of the another resistance load type differential pair.

5. The differential amplifier as claimed in claim 4 wherein the (latter) another resistance load type differential pair inputs the output of the former differential pair through one of a voltage dropping source follower or emitter follower.

6. The differential amplifier as claimed in claim 4 wherein current output terminals of the another differential pair are mutually connected with a resistor.

7. The differential amplifier as claimed in claim 5 wherein current output terminals of the another resistance load type differential pair are mutually connected with a resistor.

8. The differential amplifier as claimed in claim 1 further comprising a peak detector and a bottom detector which respectively detect a peak value and a bottom value of an input signal of the differential amplifier, and a voltage divider coupled to the peak detector and the bottom detector to divide outputs of the peak and bottom detectors to generate a threshold signal, the input signal and the threshold signal being applied to the integrated resistance load type differential pair at a first stage thereof.

9. The differential amplifier as claimed in claim 4 further comprising a peak detector and a bottom detector which respectively detect a peak value and a bottom value of an input signal of the differential amplifier and a voltage divider coupled to the peak detector and the bottom detector to divide outputs of the peak and bottom detectors to generate a threshold signal, the input signal and the threshold signal being applied to the integrated resistance type differential pair at a first stage thereof.

10. The differential amplifier as claimed in claim 5 further comprising a peak detector and a bottom detector which respectively detect a peak value and a bottom value of an input signal of the differential amplifier and a voltage divider coupled to the peak detector and the bottom detector to divide outputs of the peak and bottom detectors to generate a threshold signal, the input signal and the threshold signal being applied to the integrated resistance type differential pair at a first stage thereof.

11. The differential amplifier as claimed in claim 6 further comprising a peak detector and a bottom detector which respectively detect a peak value and a bottom value of an input signal of the differential amplifier, and a voltage divider, coupled to the peak detector and the bottom detector to divide outputs of the peak and bottom detectors to generate a threshold signal, the input signal and the threshold signal being applied to the differential pair at a first stage thereof.

12. The differential amplifier as claimed in claim 7 further comprising a peak detector and a bottom detector which respectively detect a peak value and a bottom value of an input signal of the differential amplifier, and a voltage divider coupled to the peak detector and the bottom detector to divide outputs of the peak and bottom detectors to generate a threshold signal, the input signal and the threshold signal being applied to the differential pair at a first stage thereof.

13. The differential amplifier as claimed in claim 1 wherein the bias current source comprises a current mirror.

14. The differential amplifier as claimed in claim 13 wherein the transistors composing the current mirror have cascade transistors.

* * * * *